United States Patent [19]

Kitagawa et al.

[11] Patent Number: 5,243,205
[45] Date of Patent: Sep. 7, 1993

[54] SEMICONDUCTOR DEVICE WITH OVERVOLTAGE PROTECTIVE FUNCTION

[75] Inventors: Mitsuhiko Kitagawa, Tokyo; Tetsujiro Tsunoda, Fujisawa; Akihiko Osawa, Tokyo, all of Japan

[73] Assignee: Kabushiki Kaisha Toshiba, Kawasaki, Japan

[21] Appl. No.: 899,123

[22] Filed: Jun. 18, 1992

Related U.S. Application Data

[63] Continuation of Ser. No. 597,152, Oct. 15, 1990, abandoned.

[30] Foreign Application Priority Data

Oct. 16, 1989 [JP] Japan .................. 1-268783

[51] Int. Cl.⁵ .................. H01L 29/74; H01L 29/30; H01L 29/167
[52] U.S. Cl. .................. 257/173; 257/617; 257/612; 257/113; 257/107
[58] Field of Search .............. 357/38, 38 LA, 30, 64, 357/39; 257/173, 107, 113, 612, 617

[56] References Cited

U.S. PATENT DOCUMENTS

| | | | |
|---|---|---|---|
| 4,056,408 | 11/1977 | Bartko et al. | 357/64 |
| 4,214,254 | 7/1980 | Kimura et al. | 357/64 |
| 4,314,266 | 2/1982 | Temple | 357/38 |
| 4,559,551 | 12/1985 | Nakagawa | 357/38 |
| 4,646,121 | 2/1987 | Ogura | 357/64 |
| 4,754,315 | 6/1988 | Fisher et al. | 357/38 |
| 4,929,563 | 5/1990 | Tsunoda et al. | 357/38 |
| 4,980,741 | 12/1990 | Temple | 357/38 |
| 5,003,369 | 3/1991 | Kanda et al. | 357/38 |

FOREIGN PATENT DOCUMENTS

| | | |
|---|---|---|
| 0316881 | 5/1989 | European Pat. Off. . |
| 0343369 | 11/1989 | European Pat. Off. . |
| 62-298120 | 12/1987 | Japan . |
| 1-161864 | 6/1989 | Japan . |

*Primary Examiner*—William Mintel
*Assistant Examiner*—Wael Fahmy
*Attorney, Agent, or Firm*—Finnegan, Henderson, Farabow, Garrett & Dunner

[57] ABSTRACT

In a photothyristor, a main thyristor consisting of a P emitter layer, an N base layer, a P gate base layer and an N emitter layer is formed on a semiconductor substrate. Also a pilot thyristor surrounded with the main thyristor and consisting of a P emitter layer, an N base layer, a P gate base layer and an N emitter layer is formed. In the P gate base layer, a trigger light irradiation surface including the inner surface of a recess is formed on the center of the pilot thyristor. In the N base layer, a crystal defect layer is formed under the trigger light irradiation surface by the irradiation with a radiant ray. A breakdown voltage to protect the thyristor from overvoltage is controlled by the crystal defect layer.

26 Claims, 8 Drawing Sheets

SEMICONDUCTOR DEVICE WITH OVERVOLTAGE PROTECTIVE FUNCTION

This application is a continuation of application Ser. No. 07/597,152 filed Oct. 15, 1990, now abandoned.

BACKGROUND OF THE INVENTION

1. Field of the Invention

The present invention relates to a semiconductor device with an overvoltage protective function and a method of fabricating such device, and more particularly to a semiconductor device having a better accuracy in the breakdown voltage of an overvoltage protective mechanism such as power thyristors and IGBTs handling a high voltage and to a method of fabricating such device.

2. Description of the Related Art

High capacity semiconductor devices for converting a high voltage, to which an overvoltage several times as large as a rated voltage thereof is applied, are often broken down. Accordingly, semiconductor devices containing an overvoltage protective function have been developed. Prior art will be explained taking thyristors with overvoltage protective function as an example. Overvoltage protective function is broadly classified into punch-through type and avalanche type.

Thyristors with punch-through type voltage protective function are described, for example, in the literature, Laser Trimming of Thyristors, IEEE PESC, '85, pp 463–468. In the punch-through type, a recess is provided on a P gate base layer. When a forward blocking voltage (forward voltage in off state) is applied to a thyristor, a depletion layer is formed and spread near the junction of the P gate base layer and an N base layer, with the increase of the forward blocking voltage. When the forward blocking voltage is further increased to reach a breakdown voltage $V_{BD}$, at which self protective function is performed, the depletion layer on the P gate base layer side reaches the recess to be punched through. This causes a flowing current to function as the gate current of a pilot thyristor and turn on the pilot thyristor, so that the amplified on-current of the pilot thyristor becomes the gate current of a main thyristor, whereby the main thyristor is safely turned on to cause the thyristor to be protected. The self protective breakdown voltage $V_{BD}$ is selected to set a proper value less than the minimum overvoltage $V_{BDM}$ which might break down the thyristor.

In the thyristors with a punch-through type overvoltage protective function, for example, the thickness of the depletion layer extending to the P gate base is very narrow compared with that extending to the N base due to the concentration of the impurity in the respective base layer, so that the accurate control of the self protective breakdown voltage $V_{BD}$ in the course of fabrication is very difficult with respect to mass productivity even if it can be performed in a laboratory step.

Thyristors with avalanche type voltage protective function are described, for example, in the literatures, Photothyristors with Overvoltage Protective Function, ED85-4, pp. 23–29 Toshiba; Basic Characteristics of High-Voltage Withstand Self Protective Type Photothyristors, EDD-86-53, pp. 69–75, Hitachi; and Controlled Turn-on Thyristors, IEEE, Trans-Electron Devices, ED-30, pp. 816–824 (1983) GE.

In the avalanche type thyristors, provided on a part of the P gate base layer of a PNPN structure thyristor is a region in which avalanche breakdown is more liable to occur than in other parts. By the rising transient voltage $V_{BD}$ (self protective breakdown voltage) of a destructive overvoltage, first the region is avalanche broken down, then a non-destructive avalanche current flows to the P gate base layer of a pilot thyristor, whereby the pilot thyristor and subsequently a main thyristor are turned on to attenuate the overvoltage, causing the thyristor to be protected.

The avalanche type thyristor is provided with a crook on the trigger light incident surface of the center thereof or on the junction directly under the gate electrode of the pilot thyristor. As known, the crook, on which electric field is concentrated, is more liable to occur have avalanche breakdown occur than other parts. A desired self protective breakdown voltage $V_{BD}$ is obtained by changing the curvature of the crook.

In the above conventional avalanche type thyristors, the gate base region, in which avalanche breakdown is performed, is formed in the course of element fabricating process, so that when the self protective breakdown voltage $V_{BD}$ is measured upon the completion of the element, the breakdown voltage indicates inevitably varied values because of variation in material or process. Since the avalanche voltage has a positive temperature dependence, inevitably the breakdown voltage also has a temperature dependence. This means that the breakdown voltage at a high temperature becomes higher than at a normal temperature, so that the design of thyristors becomes severe, in particular, with respect to voltage-withstand and di/dt quantity-withstand.

SUMMARY OF THE INVENTION

An object of the present invention is to provide a semiconductor device with an overvoltage protective function and a method of fabricating such device which solves the above-described problems of semiconductor devices with an overvoltage protective function, has a less variation in the self protective breakdown voltage $V_{BD}$, and can be mass produced with a yield and cost substantially equal to semiconductor devices without an overvoltage protective function.

A first semiconductor device according to the present invention is a semiconductor device with an overvoltage protective function having a plurality of PN junctions formed on a semiconductor substrate and comprises a first conductive type semiconductor layer exposed to the main surface of the substrate, a second conductive type semiconductor layer in contact with the underside opposite to the exposed surface of the first conductive type semiconductor layer, and a high-density crystal defect layer formed in a region in which a depletion layer is formed when a specified reverse voltage is applied to the PN junction between the first conductive type semiconductor layer and the second conductive type semiconductor layer, and at a position in which a main current is not disturbed.

A second semiconductor device according to the present invention is a semiconductor device with overvoltage protective function which comprises a first semiconductor element and a second semiconductor element having a breakdown voltage less than the first semiconductor element and in which the breakdown of the second semiconductor element causes the first semiconductor element to be protected from overvoltage, wherein the second semiconductor element comprises a crystal defect layer formed by the irradiation of a radiant ray and the breakdown voltage of the second semiconductor element controlled by the crystal defect layer.

Also, a method of fabricating semiconductor devices according to the present invention includes a process in which a specified region is irradiated with a radiant ray such as proton, heavy hydrogen, α-ray and a neutron to form a high-density crystal defect layer.

The high-density crystal defect layer formed by the irradiation with a radiant ray has features such as a good controllability of breakdown voltage and an easy limitation of formed region. The present invention utilizes such properties to solve the problems of the prior art.

The overvoltage protective function is a function to protect a semiconductor element from an excessive forward blocking voltage (forward voltage in off state). When an excessive forward blocking voltage (hereinafter simply referred to as an overvoltage) is applied to a semiconductor element without protective function, a breakdown occurs in an unspecified limited part. With the breakdown current in the unspecified limited part, in many cases, the part between main electrodes cannot be smoothly converted to turn on, so that the overcurrent due to overvoltage is concentrated in the vicinity of the unspecified limited part, causing the semiconductor element to be destroyed. The minimum destructive overvoltage is expressed as $V_{BDM}$.

The self protective breakdown voltage $V_{BD}$ is previously determined in the design stage to be smaller than the voltage $V_{BDM}$, and a non-destructive breakdown voltage. The region in which a breakdown occurs by the voltage $V_{BD}$ is a limited specified region.

In the present invention, the above-described specified regions include: (1) a region of a substrate which is out of the main current path, (2) a region located under a conductor electrode film (for example, the gate electrode film of the trigger step for thyristors) or a trigger light irradiation surface, (3) a region including the region in which a depletion layer is formed when a specified reverse voltage (self protective breakdown voltage $V_{BD}$) is applied to the PN junction blocking a forward voltage during off time, and (4) a region in which a higher density crystal defect than nearby regions exists.

When a destructive overvoltage is applied to a semiconductor device arranged as described above and then a transient voltage in the course of the rise of the overvoltage reaches the self protective breakdown voltage $V_{BD}$, a breakdown current flows through the specified region.

The overvoltage protective function utilizes the breakdown current and immediately attenuates or shuts off the destructive overvoltage to protect the semiconductor device.

In many devices such as thyristors, the breakdown current occurs in the high-density crystal defect of a specified region, that is, a control region (such as the gate region and the light trigger region) and becomes a gate current or a trigger current to turn on the part between main electrodes of a device, thereby causing a destructive voltage to be attenuated and the device to be protected.

On the other hand, a destructive voltage may be attenuated by a self protective breakdown current itself, or proper means for attenuating or shutting off the overvoltage may be provided outside the device and be controlled by the self protective breakdown current.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

In a semiconductor device with an overvoltage protective function according to the present invention, a high-density crystal defect layer is formed by irradiation with a radiant ray, thereby reducing the variation of the self protective breakdown voltage.

In the prior art, it has been experimentally known that when a semiconductor substrate is irradiated with a radiant ray such as a proton (H+), a crystal defect layer is formed, in which layer a donor (acceptor) due to crystal defect occurs, and the lifetime of a carrier becomes short and causes the breakdown voltage to be reduced (for example, W. Wondrak et al., ISPSD, 1988, Tokyo, pp. 147–152).

Figure 8A:
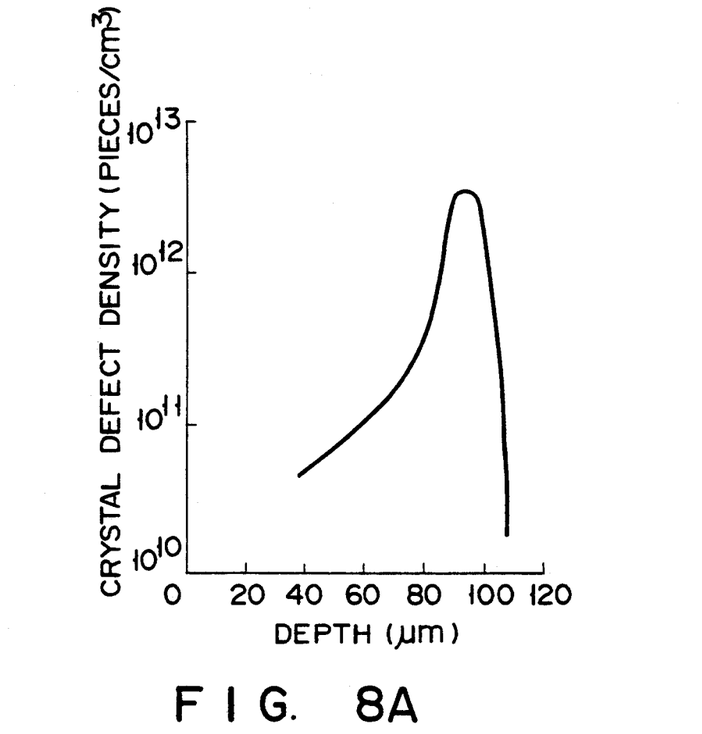
FIGS. 8A and 8B are a distribution graph of crystal defect density vs. substrate depth at the time of proton irradiation and a graph showing the relationship between the accelerated voltage and the stoppage depth of proton, respectively.

FIG. 8A shows a profile of crystal defect density vs. substrate depth when an N type Si substrate is irradiated by a proton (H+) with a accelerated voltage of 3 MeV. The axis of the ordinate represents a depth from the substrate (μm) and the abscissa represents a crystal defect density (pieces/cm³). The curve in the graph indicates the defect density at a respective depth. As shown in the graph, the defect density occurring by proton irradiation is concentrated at the place near the range of the proton, that is, the place directly before the stoppage of proton particles. This means that a high-density crystal defect layer with a thickness limited in the depth direction can be formed by the irradiation of a proton.

Figure 8B:
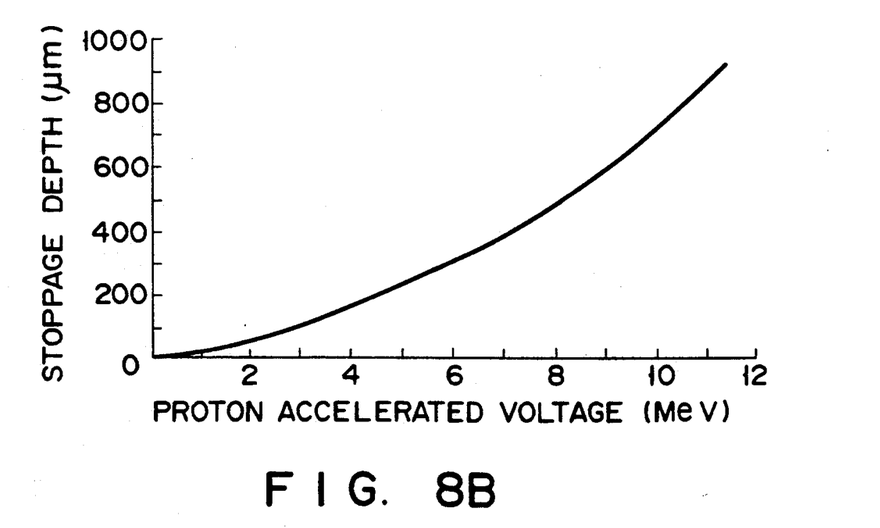

FIG. 8B is a graph showing the relationship between the accelerated voltage (MeV) and the stoppage depth (μm) of proton, which is obtained by calculation. Trial results reveal that when the accelerated voltage of the proton is set to 10 MeV, a crystal defect layer is formed at the depth of about 700 μm beneath the Si substrate surface, showing good agreement with theory.

Figure 9:
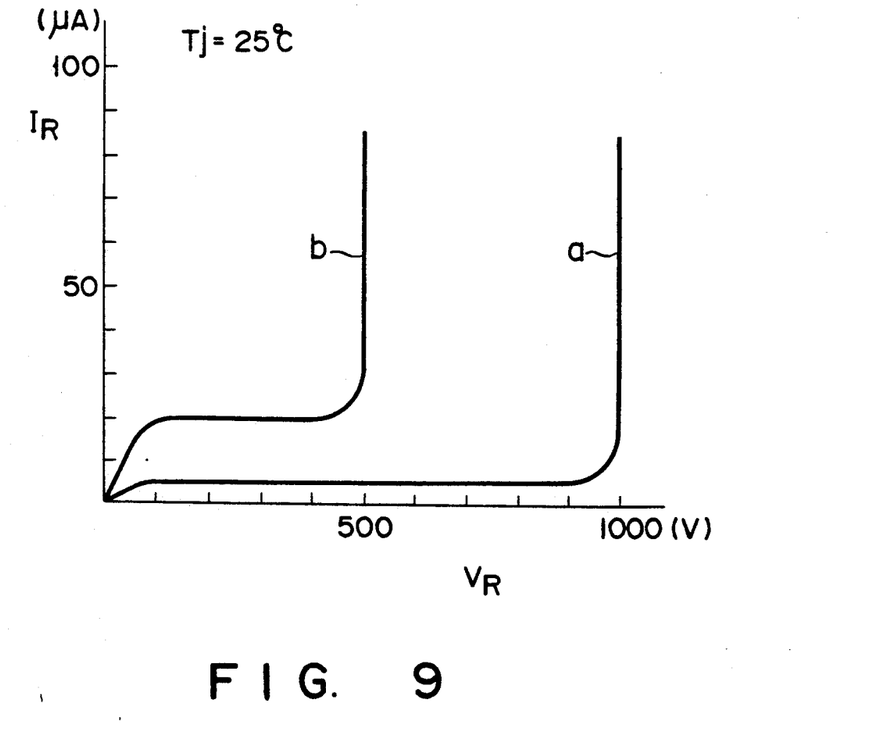
FIGS. 9 and 10 are graphs showing the relationship between the dose quantity of proton irradiation and the voltage-withstand of diode.
Figure 10:
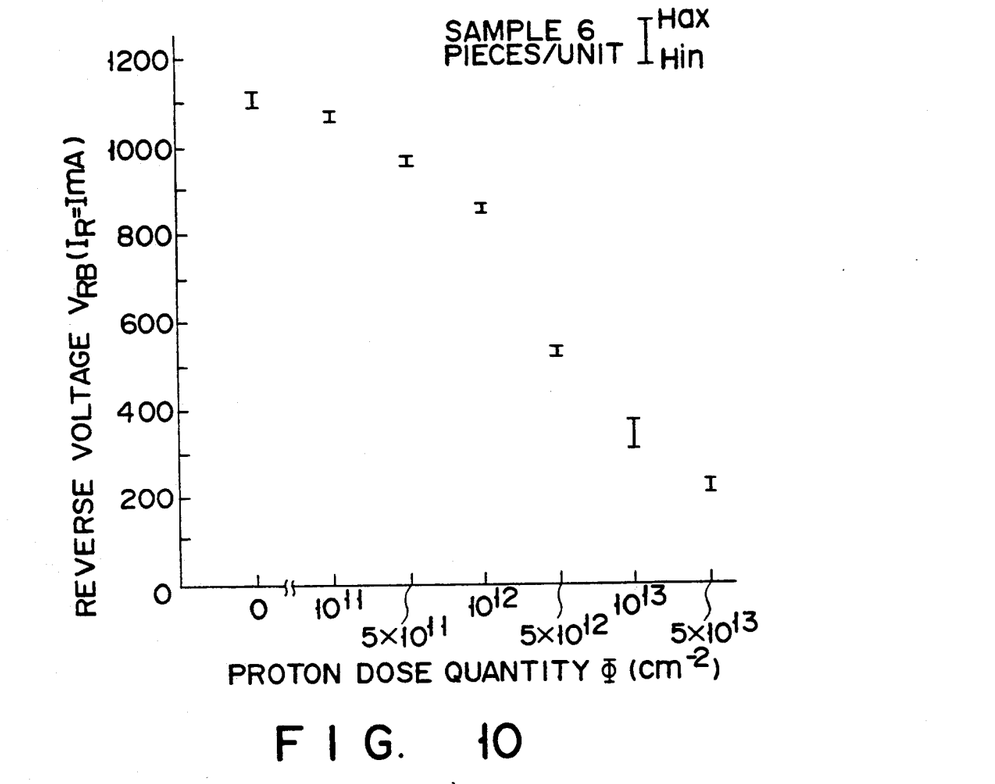

FIGS. 9 and 10 are graphs showing the results of an experiment performed to obtain the relationship between the dose quantity of proton irradiation and the voltage-withstand of a diode.

FIG. 9 shows the relationship between reverse voltage $V_R$ and reverse current $I_R$ flowing when the reverse voltage is applied to a PIN diode, that is, an example of $V_R$-$I_R$ characteristics. In FIG. 9, the curve a, represents a diode not irradiated with protons, which is broken down at about 1000 V. The curve b shows an example of $V_R$-$I_R$ characteristics measured after the N region of the diode is irradiated with protons with an accelerated voltage of 2 MeV and a dose quantity of $5 \times 10^{12}$ [cm$^{-2}$] to form a crystal defect layer. In this case, the diode is broken down at about 500V. FIG. 10, showing voltage-withstand characteristics, is the results of an experiment performed in a substantially similar method to that shown in FIG. 9. The abscissa represents a dose quantity $\Phi$ [cm$^{-2}$] of proton irradiation, and the ordinate represents a reverse voltage $V_{RB}$ [V] when a reverse current $I_R$ increases to become 1 mA, which may be assumed to be substantially a breakdown voltage. The dose quantity of proton irradiation was allowed to change stepwise from $\Phi=0$ (when not irradiated) to $5 \times 10^{13}$ [cm$^{-2}$]. Six specimens were used for each dose quantity, and the vertical short lines in the graph indicate the distribution range of the $V_{BD}$ of the six specimens. The experimental results shown in FIGS. 9 and 10 indicate that the reverse voltage $V_{RB}$ of a diode, that is, the breakdown voltage of a PN junction can be controlled by changing the dose quantity of proton irradiation, and at that time the variation of the breakdown voltage is very small.

Figure 1:
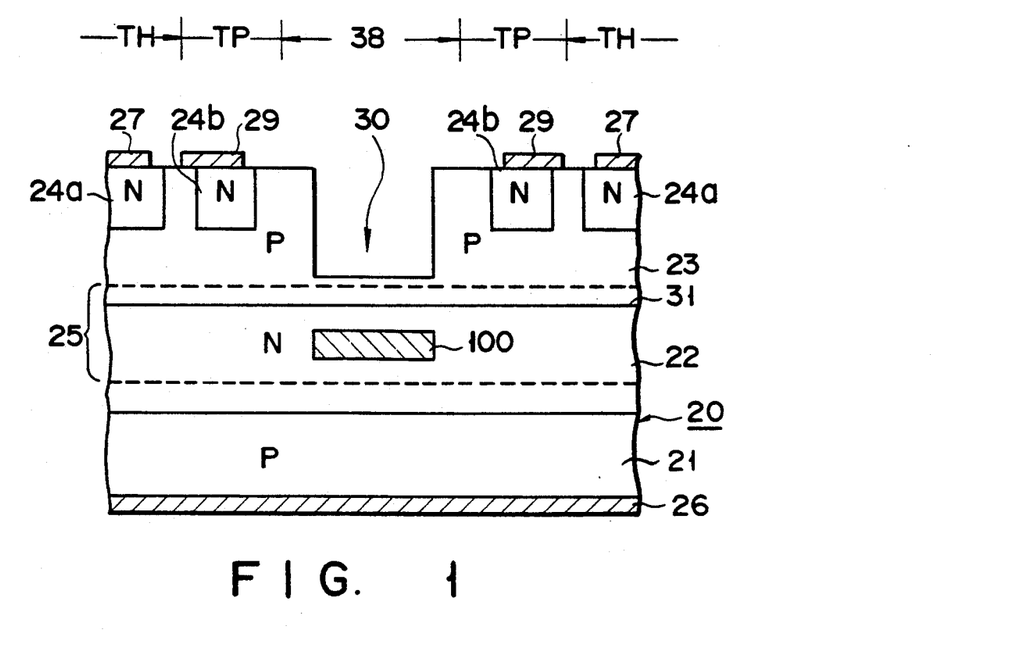
FIGS. 1 through 3 are sectional views of semiconductor devices of first through third embodiments according to the present invention.

An embodiment in which the present invention is applied to a photothyristor will be explained hereinafter. FIG. 1 is a typical sectional view near the center of such thyristor. On a semiconductor substrate 20, a main thyristor TM consisting of a P emitter layer 21, an N base layer 22, a P gate base layer 23 and an N emitter layer 24a is formed, and a pilot thyristor TP surrounded with the main thyristor TM and consisting of the P emitter layer 21, the N base layer 22, the P gate base layer 2,3 and an N emitter layer 24b, is formed. The region surrounded by the pilot thyristor TP is the gate region of the pilot thyristor TP, and is provided with a phototrigger mechanism. The phototrigger mechanism comprises a first conductive type semiconductor layer (P gate base layer) 23 exposed to the main surface of the substrate (in this case, taken as the upper surface of the substrate), a trigger light irradiation surface 38 being the exposed surface of the P gate base layer 23 including the inner surface of a recess 30, a second conductive type semiconductor layer (N base layer) 22 in contact with the underside of the P gate base layer 23, and the P emitter layer 21. In the photothyristor according to the present invention, a high-density crystal defect layer 100 is provided in a region 25 in which a depletion layer is formed when a reverse voltage substantially equal to the self protective breakdown voltage $V_{BD}$ is applied to a PN junction 31 of the P gate base layer 23 and the N base layer 22. The element 26 indicates an anode electrode, 27 a cathode electrode of the main thyristor, and 29 an amplification gate electrode (equivalent to a cathode electrode of the pilot thyristor). The graphic display of a passivation film and the like with which the main substrate surface is covered is omitted.

The operation of the above-described photothyristor will be explained hereinafter. When, with a forward blocking voltage applied between the anode electrode 26 and the cathode electrode 27, the trigger light irradiation surface 38 is irradiated by a trigger light, an excessive carrier due to photoexcitation occurs on the P gate base layer 23 and the N base layer 22 including the depletion layer under the irradiation surface 38. The pilot thyristor, particularly being of a high gate sensitivity structure, is turned on by the light gate current. Subsequently the turn-on current causes the main thyristor to be turned on, whereby the thyristor becomes on. The main current path of the thyristor is taken as the substrate region directly under the cathode electrode 27 through which the main part of a main current (on-current of the main thyristor) flows. Part of the main current extends horizontally and flows through the N base layer 22 directly under the pilot thyristor TP and the trigger light irradiation surface and through the P emitter layer 21. However, the ratio of that part of the main current is small, so that the current path of that part is not included in the main current path in this embodiment.

A case where an accidental, destructive overvoltage is applied between the anode electrode 26 and the cathode electrode 27 of the thyristor in off state will be explained hereinafter. Generally, an overvoltage rises from a low voltage and reaches a destructive overvoltage. While a voltage applied is low, the voltage is blocked by the depletion layer of the PN junction 31, so that the thyristor is kept off. When the voltage applied is increased, the depletion layer expands and the electric field in the depletion layer becomes strong, and when the voltage reaches the self protective breakdown voltage $V_{BD}$, an avalanche breakdown occurs in the crystal defect layer 100, and a breakdown current flows through the anode electrode 26 and the amplification gate electrode 29 to the cathode electrode 27. The breakdown current, similar to the above-described light gate current, becomes a gate current of the pilot thyristor TP, so that the pilot thyristor and subsequently also the main thyristor are turned on. This causes the overvoltage applied to the thyristor to be attenuated before reaching a destructive overvoltage, whereby the thyristor is protected from destruction.

The method of fabricating the above-described photothyristor is substantially the same as the prior art known fabricating method except for the process to form the crystal defect layer 100.

In the photothyristor (rated about 1000V) of the present embodiment, the crystal defect layer 100 is formed by proton irradiation in the final process of element fabrication. At this time, the layer is irradiated from the anode side (underside of the substrate) with the accelerated voltage of protons being 10 MeV and the dose quantity $1 \times 10^{13}$ cm$^{-2}$ or more. A mask for proton beam was used which was an aluminum plate with a thickness of 700 μm or more and had an opening with an area substantially equal to the light trigger irradiation surface provided under the substrate 22 and opposite to the irradiation surface.

The crystal defect layer formed thus is reduced in life time corresponding to the defect density thereof, so that the position and extent of the layer as a low life time layer can be confirmed by the spreading resistance method or the DLTS (Deep Level Transient Spectroscopy). In the above-described embodiment, the peak of the crystal defect layer (called also a low breakdown layer or low life time layer) 100 existed in a depth of about 700 μm from the underside of the substrate.

Figure 11:
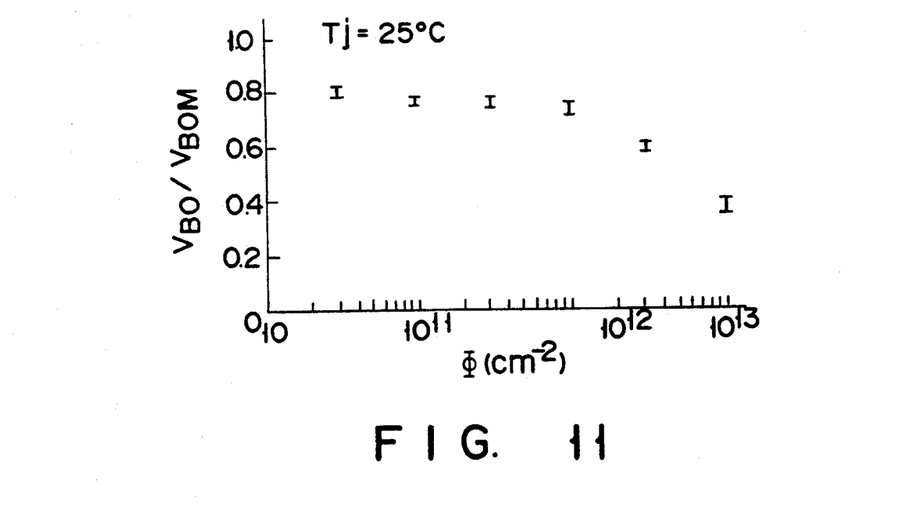
FIG. 11 is a graph showing the relationship between the does quantity of proton irradiation and the self protective breakdown voltage $V_{BD}$.

Then, thyristors having substantially the same structure as the photothyristor of the above-described embodiment and having the dose quantity of proton irradiation changed were prepared, and the respective self protective breakdown voltage $V_{BD}$ was examined. FIG. 11 shows an example of the results. The abscissa represents a dose quantity $\Phi$ [cm$^{-2}$] or proton irradiation, and the ordinate represents a normalized value ($V_{BD}/V_{BDM}$) of the self protective breakdown voltage $V_{BD}$ based on the breakdown voltage $V_{BDM}$ (6 KV) without proton irradiation. The accelerated voltage of irradiated protons is taken as 10 MeV, and the junction temperature Tj as 25° C. The vertical short lines in FIG. 11 indicate the distribution range of measured values. As shown in FIG. 11, the self protective breakdown voltage of a photothyristor can be accurately controlled by the dose quantity of proton irradiation.

It is preferable that the position of the crystal defect layer 100 in the depth direction is disposed in the depletion layer of the N base layer 22 nearer the junction 31 than the center of the N base layer. Care must be taken to confirm the position in the depth direction because, where a crystal defect layer is formed in the N base layer, the characteristics in the reverse direction of a thyristor, particularly the breakdown voltage in the reverse direction may vary depending on the position in the depth direction. Generally, a crystal defect layer can be formed in the position including part of the region in which a depletion layer is formed, or in a depletion layer across the junction 31. Although the proton irradiation from the underside of the substrate was performed in the present embodiment, the irradiation from the top side of the substrate may also be performed. Although proton irradiation can be performed in the course of the process of element fabrication, it is preferable that it is performed in the final processing of a wafer process as shown in the present embodiment. The self protective breakdown voltage is easily controlled, and an addition of dose quantity or redoing of irradiation can be performed.

Figure 2:
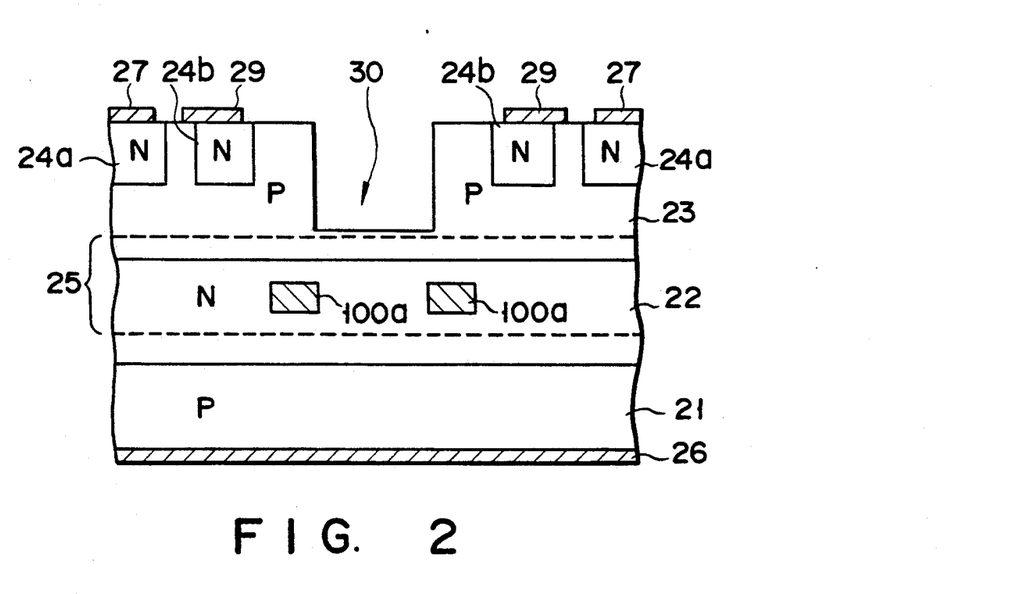

FIG. 2 shows a second embodiment according to the present invention. The same reference numeral as in FIG. 1 indicates the same element, so that the explanation of those elements may is omitted. The thyristor in the second embodiment is different from the photothyristor shown in FIG. 1 in the shape of the crystal defect layer. That is, the crystal defect layer 100a is made a ring-shape layer having an opening directly under the base of the recess of the trigger light irradiation surface 38, and is an example in which a decrease of the light gate current in normal operation is prevented.

Having described photothyristors in the first and second embodiment, the present invention can also be applied to usual electric trigger thyristors and also to thyristors without a pilot thyristor.

Figure 3:
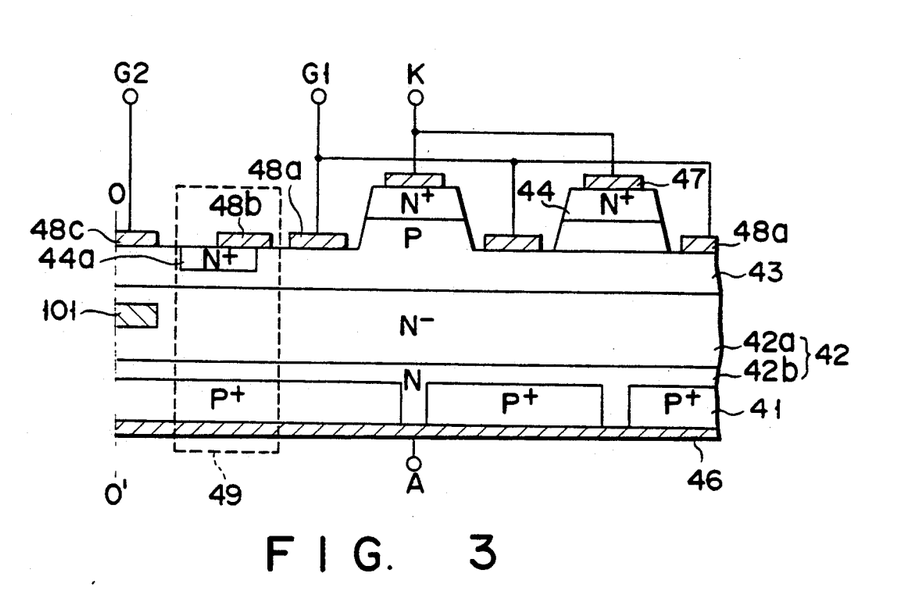

With reference to FIG. 3, a third embodiment in which the present invention is applied to a GTO will be explained hereinafter. FIG. 3 is a typical sectional view in the radius direction including the center axis OO' perpendicular to the main surface of the GTO according to the present invention. The GTO comprises a P+ emitter layer 41, an N base layer 42, a P gate base layer 43 and an N+ emitter layer 44. The N base layer 42 is composed of a lamination of an N− base layer 42a and a N base layer 42b, and part of the N base layer 42b extends to the underside of the substrate and is shorted to the P+ emitter layer 41 by an anode electrode 46 to form a so-called emitter short-circuit structure. The N+ emitter layer 44 is formed on the island-shape mesa base on the top side of the substrate, and provided with a cathode electrode 47. A gate electrode (terminal G$_1$) 48a is formed in such a manner as to surround the N+ emitter layer 44. The present GTO, to which an amplification gate structure 49 surrounded with broken lines is further added, is called a so-called GTO with amplification gate. The amplification gate structure 49, to which an N+ emitter layer 44a and an amplification gate electrode 48b are added, amplifies on-gate signals inputted from a gate electrode (terminal G$_2$) 48c. The gate terminal G$_1$ is connected through a diode and the like (not shown) to the gate terminal G$_2$. The reference numeral 101 indicates a high-density crystal defect layer according to the present invention, which is provided in a specified place of the N− base layer 42a under the conductor electrode film (gate electrode) 48c.

Also, the present invention can undoubtedly be applied to a GTO without the amplification gate structure 49.

Figure 4:
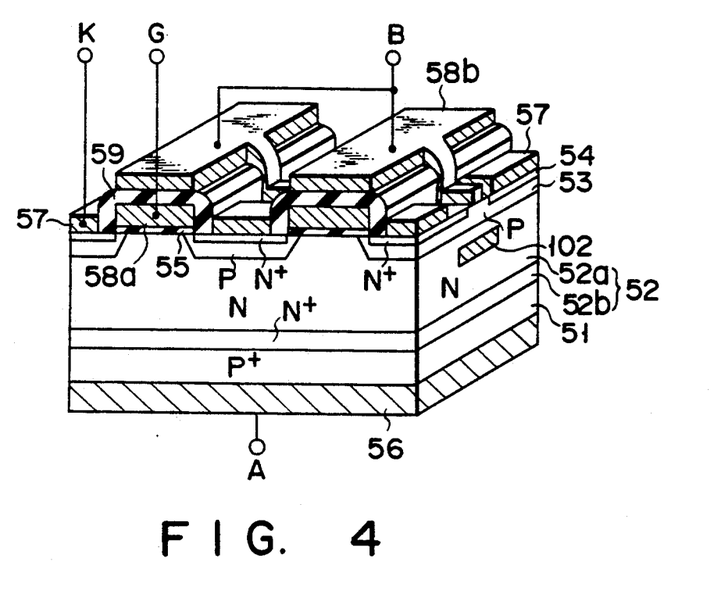
FIG. 4 is a perspective view of a semiconductor device of a fourth embodiment according to the present invention.

With reference to FIG. 4, a fourth embodiment in which the present invention is applied to a MOS control thyristor will be explained hereinafter. FIG. 4 is a perspective view, with the main part of the thyristor according to the present invention taken out. The thyristor section is composed of a P+ emitter layer 51, an N base layer 52 consisting of an N layer 52a and an N+ layer 52b laminated with each other, a P base layer 53 and an N+ emitter layer 54. The MOS structure is composed of a surface layer (channel forming layer) of the P base layer 53 put between the N base layer 52 and the N+ emitter layer 54 and exposed to the substrate surface, a gate oxidation film 55 and a gate electrode 58a. Further, provided is a base electrode 58b in contact with the part of the P base layer 53 surrounded with the N+ emitter layer 54. The base electrode 58b is provided to improve mainly the off-characteristics of the thyristor. A high-density crystal defect layer 102 according to the present invention is provided on a specified place of the N base layer 52a under the conductor electrode film (base electrode) 58b. The reference numerals 56 and 57 indicate an anode electrode and a cathode electrode, respectively, and elements A, K, G and B indicate respective terminals of anode, cathode, gate, and base, respectively. Also, the reference numeral 59 indicates an interlayer insulation layer between the cathode electrode 57 and the gate electrode 58a.

Figure 5:
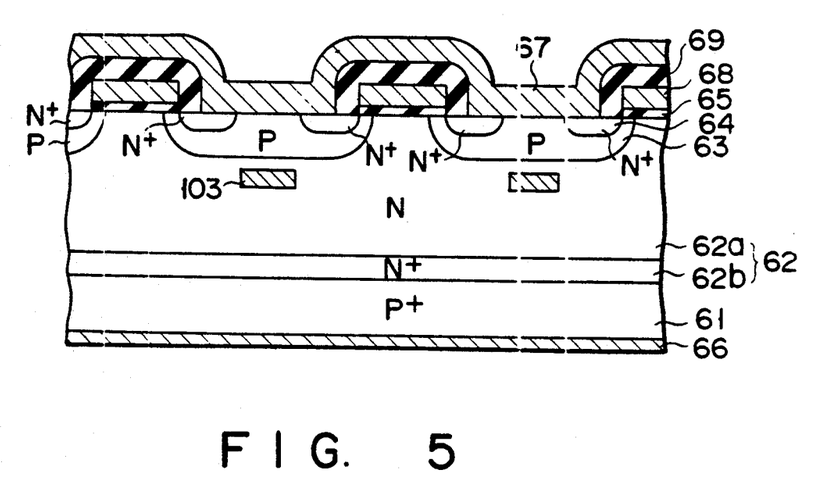
FIGS. 5 and 6 are sectional views of semiconductor devices of fifth and sixth embodiments according to the present invention.

With reference to FIG. 5, a fifth embodiment in which the present invention is applied to an insulation-gate type bipolar transistor (hereinafter abbreviated as an IGBT) will be explained hereinafter. FIG. 5 is a sectional view of an IGBT according to the present invention. The structure has a P+ emitter layer (also called a collector layer) 61, an N drift layer 62 consisting of an N layer 62a and an N+ layer 62b, and a P base layer 63 formed from the main surface of one side. An N+ emitter layer 64 is formed in the base layer 63. A surface layer (channel forming layer) of the P base layer 63 put between the N+ emitter layer 64 and the N drift layer 62a is opposed through an oxidation film 65 to a gate electrode 68 to form a MOS structure. The P base layer 63 and the N+ emitter layer 64 become a structure shorted by a conductor electrode film (called a cathode or emitter electrode). The reference numeral 69 indicates an interlayer insulation layer, and the reference numeral 66 represents an anode electrode (also called a collector electrode). A high-density crystal defect layer 103 according to the present invention is provided on a specified place of the N drift layer 62a under a conductor electrode film 67 of the part in contact with the P base layer 63 surrounded with the N+ emitter layer 64.

Figure 6:
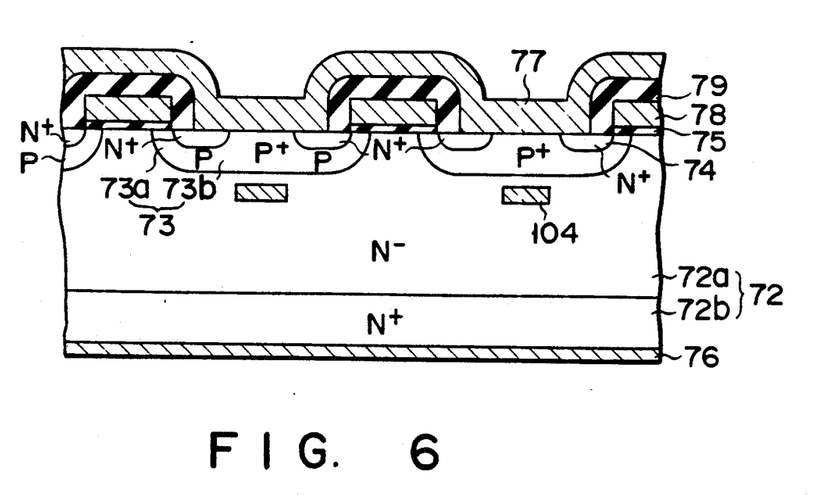

With reference to FIG. 6, a sixth embodiment in which the present invention is applied to a double diffusion vertical type N-channel MOSFET will be explained hereinafter. FIG. 6 is a sectional view of the FET. The reference numeral 72 indicates an N drain layer, which consists of a low-density N− layer 72a and a high density N+ layer 72b. Reference numeral 73 indicates a P base layer, which consists of a low-density P base layer 73a and a high-density P+ base layer 73b. In the P base layer, a ring-shape N+ source layer 74 is formed surrounding the P+ base layer 73b. A surface layer of the P base layer 73a put between the N+ source layer 74 and the N− drain layer 72a is called a channel forming layer. Through a gate oxidation film 75, a gate electrode 78 is provided opposite to the channel forming layer 72A. A conductor electrode film (source electrode) 77 is provided in ohmic contact with the N+ source layer 74 and the P+ base layer 73b. Reference numeral 76 indicates a drain electrode, and reference numeral 79 represents an interlayer insulation layer. A freewheeling diode is formed by the P+ base layer 73b and the N drain layer 72. Accordingly, the part in ohmic contact with the P+ base layer 73b of the conductor electrode film 77 serves also as an anode electrode of the freewheeling diode. A high-density crystal defect layer 104 according to the present invention is provided on a specified place of the N− drain layer 72a under the anode electrode of the freewheeling diode.

When, in the embodiments 3 through 6, an excessive forward blocking voltage is applied between the anode (drain) and the cathode (emitter) of each device and a transient voltage in the course of the rise of the overvoltage reaches the self protective breakdown voltage, an avalanche breakdown occurs in the high-density crystal defect layer, whereby a breakdown current flows, the device is turned on and the overvoltage is attenuated, with the result that the device is protected.

Figure 7A:
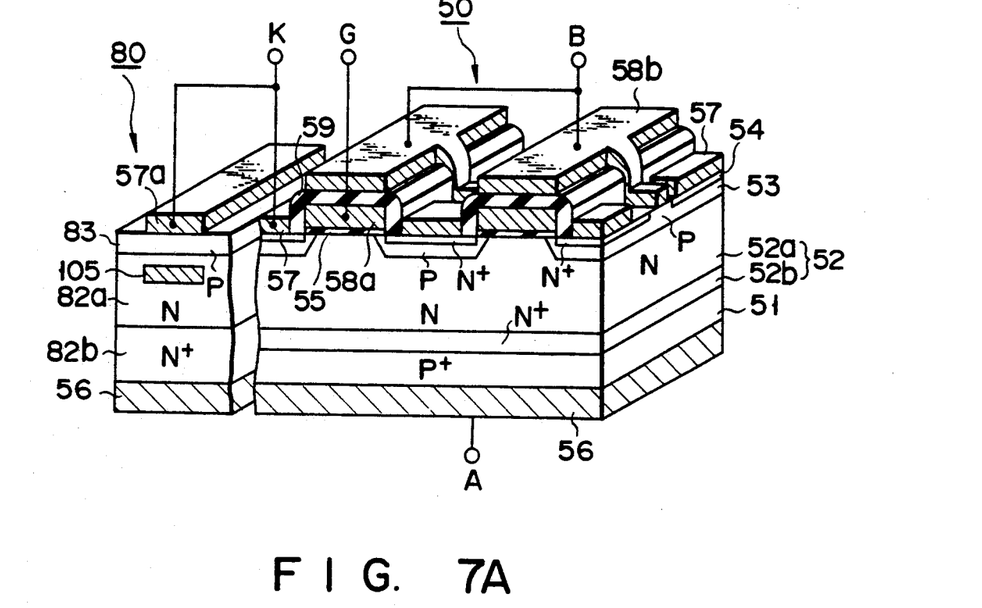
FIGS. 7A and 7B are a perspective view and an electrically equivalent circuit diagram, respectively, of semiconductor device of a seventh embodiment according to the present invention.
Figure 7B:
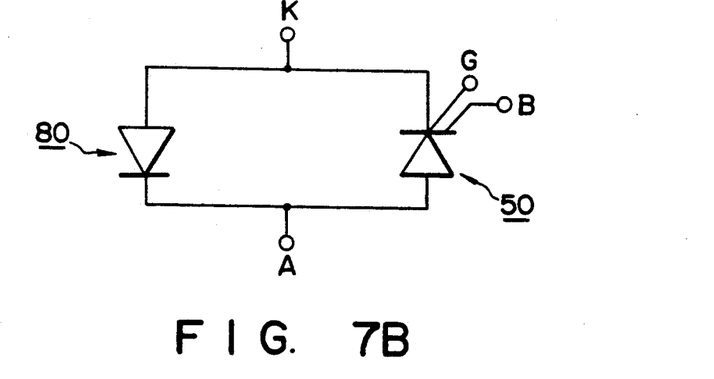

FIGS. 7A and 7B show a seventh embodiment according to the present invention. In the present device, a self protective diode 80 is provided in reverse polarity between a cathode electrode 57 and an anode electrode 56 of a MOS control thyristor 50. FIG. 7A is a perspective view of the device, and FIG. 7B is an electrically equivalent circuit diagram. The same sign as in FIG. 4 indicates the same part. The self protective diode 80 is formed by laminating a conductor electrode film 57a, a P layer 83, an N layer 82a, an N+ layer 82b and the electrode film 56. A high-density crystal defect layer 105 according to the present invention is provided on a specified place of the N layer 82a under the conductor electrode film 57a. The conductor electrode film 57a and the N layer 82a can be formed in the same body together with the cathode electrode 57 and the anode electrode 56 of the MOS control thyristor 50.

When the self protective diode 80 is reverse biased by an overvoltage and reaches the self protective breakdown voltage $V_{BD}$, a high-density crystal defect layer develops an avalanche breakdown, causing the diode 80 to be broken down. The self protective breakdown current causes the overvoltage to be attenuated and the thyristor 50 to be protected. At this time, though not shown, with proper overvoltage attenuation means or overvoltage shut-off means provided outside the device, the device may be controlled by the above-described self protective breakdown current.

Although the seventh embodiment uses the MOS control thyristor 50 as an example, the present invention can also be applied to other power semiconductor devices such as thyristors, IGBTs, GTOs, MOSs and FETs.

Figure 12:
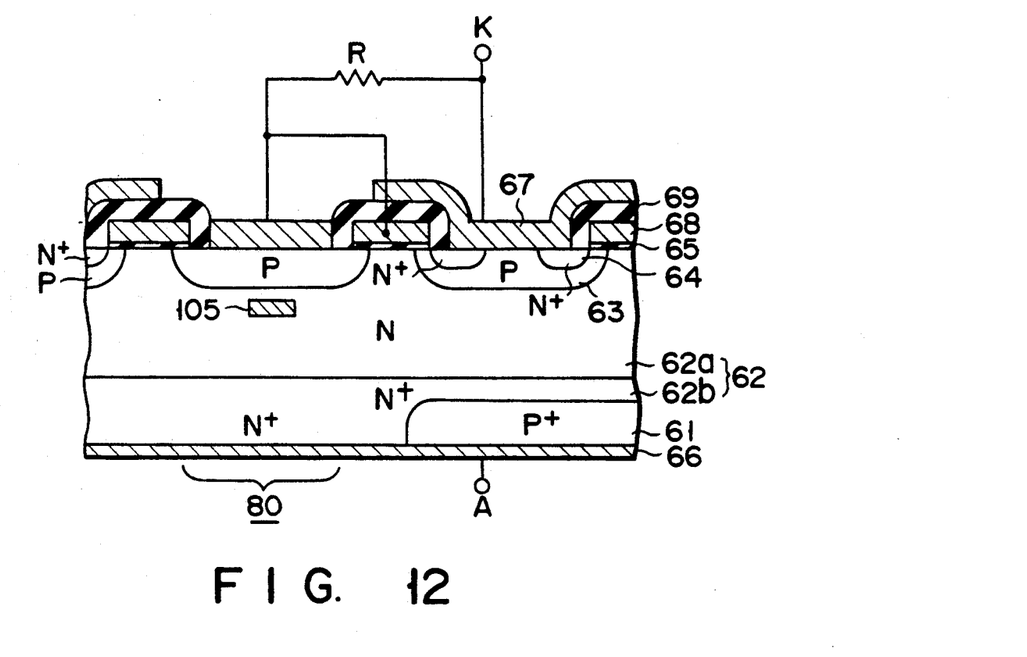
FIGS. 12 and 13 are sectional views showing semiconductor devices of eighth and ninth embodiments according to the present invention.
Figure 13:
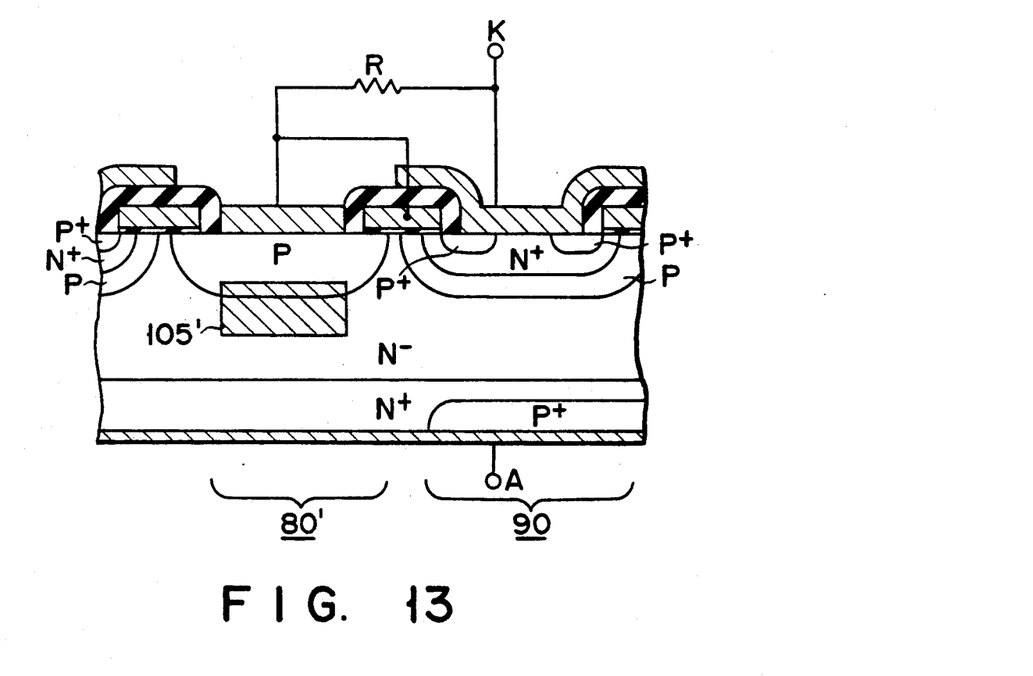

FIGS. 12 and 13 are sectional views showing semiconductors in an eighth and a ninth embodiments, respectively, according to the present invention.

The eighth embodiment shown in FIG. 12 has a structure in which the IGBT shown in FIG. 5 is combined with the protective diode 80 shown in FIG. 7A and the same reference numerals as the preceding embodiments are assigned to the same part.

Also, the ninth embodiment shown in FIG. 13 has a structure in which a protective diode 80' is combined with a MOS control thyristor 90 having a turn-off channel instead of the IGBT of the eighth embodiment. However, a crystal defect layer 105' of the protective diode 80' in the embodiment exists across the PN junction.

Besides the above-described embodiments, the present invention can be applied to semiconductor devices requiring another overvoltage protective mechanism such as SI thyristor.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device, with overvoltage protective function, comprising:
   a first semiconductor layer of a first conductivity type;
   a second semiconductor layer of a second conductivity type formed on said first semiconductor layer;
   a third semiconductor layer of the first conductivity type formed on said second semiconductor layer;
   a fourth semiconductor layer of the second conductivity type formed on a first area of said third semiconductor layer;
   a gate region formed on a second area of said third semiconductor layer; and
   a high-density crystal defect layer formed only in an area in which a depletion layer is formed when a specified reverse voltage is applied to a PN junction between said second and third semiconductor layers, at a position under said gate region and in which a main current is not disturbed.

2. The device according to claim 1, wherein said gate region comprises a trigger light irradiation surface which is an exposed surface of said third semiconductor layer.

3. The device according to claim 1, wherein said gate region comprises a gate electrode in contact with said third semiconductor layer.

4. The device according to claim 1, wherein the crystal defect layer is formed across the PN junction between said second and third semiconductor layers.

5. The device according to claim 1, wherein said crystal defect layer is a ring-shaped layer having an opening under said gate region.

6. The device according to claim 1, wherein said device constitutes a thyristor.

7. A semiconductor device, with overvoltage protective function, comprising:
- a first semiconductor layer of a first conductivity type;
- a second semiconductor layer of a second conductivity type formed on said first semiconductor layer;
- a third semiconductor layer of the first conductivity type formed on said second semiconductor layer;
- a fourth semiconductor layer of the second conductivity type formed on a first area of said third semiconductor layer;
- an electrode film formed on a second area of said third semiconductor layer; and
- a high-density crystal defect layer only in an area in which a depletion layer is formed when a specified reverse voltage is applied to a PN junction between said second and third semiconductor layers, at a position under said electrode film and in which a main current is not disturbed.

8. The device according to claim 7, wherein said electrode film constitutes a gate electrode.

9. The device according to claim 7, wherein said electrode film constitutes a base electrode.

10. The device according to claim 7, further comprising:
- a first device comprising said first and fourth semiconductor layers and first portions of said second and third semiconductor layers, and having a first breakdown voltage; and
- a second device comprising second portions of said second and third semiconductor layers, said electrode film, and said crystal defect layer, and having a second breakdown voltage, which is less than said first breakdown voltage, and which protects said first device from overvoltage;
wherein said crystal defect layer is formed by irradiation with a radiant ray and said second breakdown voltage is controlled by said crystal defect layer.

11. The device according to claim 10, wherein said first device has a MOS gate, and wherein a voltage generated by a breakdown current of said second device causes said first device to be turned ON.

12. The device according to claim 7, wherein a breakdown current of said second device causes said first device to be turned ON.

13. A semiconductor device with overvoltage protective function, comprising:
- a first semiconductor layer of a first conductivity type;
- a second semiconductor layer of a second conductivity type formed on said first semiconductor layer;
- a third semiconductor layer of the first conductivity type formed on a first area of said second semiconductor layer; and
- a high-density crystal defect layer formed only in an area which a depletion layer is formed when a specified reverse voltage is applied to a PN junction between said first and second semiconductor layers, wherein
said third semiconductor layer is not formed above said high density crystal defect layer.

14. The device according to claim 13, wherein a fourth semiconductor layer of said second conductivity type, is formed under said first semiconductor layer.

15. The device according to claim 14, wherein said device constitutes a thyristor, and a gate region is formed on said second semiconductor layer above said crystal defect layer.

16. The device according to claim 15, wherein said gate region comprises a trigger light irradiation surface which is an exposed surface of said second semiconductor layer.

17. The device according to claim 15, wherein said gate region comprises a gate electrode in contact with said second semiconductor layer.

18. The device according to claim 15, wherein said crystal defect layer is formed across the PN junction between said first and second semiconductor layers.

19. The device according to claim 15, wherein said crystal defect layer is a ring-shaped layer having an opening under said gate region.

20. The device according to claim 14, wherein an electrode film is formed on said third semiconductor layer above said crystal defect layer.

21. The device according to claim 20, wherein said electrode film constitutes a gate electrode.

22. The device according to claim 20, wherein said electrode film constitutes a base electrode.

23. The device according to claim 20, further comprising:
- a first device comprising said third and fourth layers and first portions of said first and second layers, and having a first breakdown voltage; and
- a second device comprising second portions of said first and second layers, said electrode film, and said crystal defect layer, and having a second breakdown voltage which is less than said first breakdown voltage, and which protects said first device from overvoltage;
wherein said crystal defect layer is formed by irradiation with a radiant ray and said second breakdown voltage is controlled by said crystal defect layer.

24. The device according to claim 13, wherein an electrode film is formed on said third semiconductor layer and above said crystal defect layer.

25. The device according to claim 24, wherein said device constitutes a transistor and said second semiconductor layer is a base layer.

26. The device according to claim 2, wherein said trigger light irradiation surface comprises a recess in said third semiconductor layer.

* * * * *